United States Patent

Kawai et al.

[11] Patent Number: 5,821,133
[45] Date of Patent: Oct. 13, 1998

[54] METHOD OF MANUFACTURING ACTIVE MATRIX SUBSTRATE

[75] Inventors: Katsuhiro Kawai, Yamatotakada; Mikio Katayama, Ikoma; Satoshi Yabuta, Taki-gun; Masaru Kajitani, Osaka, all of Japan

[73] Assignee: Sharp Kabushiki Kaisha, Osaka, Japan

[21] Appl. No.: 576,036

[22] Filed: Dec. 21, 1995

[30] Foreign Application Priority Data

Dec. 27, 1994 [JP] Japan ................................. 6-326205

[51] Int. Cl.⁶ ................................................ H01L 21/786
[52] U.S. Cl. ........................... 438/30; 438/158; 438/722
[58] Field of Search ........................... 438/30, 149, 151, 438/155, 158, 164, 722; 148/DIG. 150; 349/43

[56] References Cited

U.S. PATENT DOCUMENTS

| | | | |
|---|---|---|---|
| 4,933,296 | 6/1990 | Parks et al. | 438/30 |
| 5,032,531 | 7/1991 | Tsutsui et al. | 438/30 |
| 5,075,674 | 12/1991 | Katayama et al. | 349/43 |
| 5,102,361 | 4/1992 | Katayama et al. | 438/30 |
| 5,166,086 | 11/1992 | Takeda et al. | 438/30 |
| 5,231,039 | 7/1993 | Sakono et al. | 438/30 |

FOREIGN PATENT DOCUMENTS 6-95149 4/1994 Japan.

*Primary Examiner*—Michael Trinh
*Attorney, Agent, or Firm*—Nixon & Vanderhye P.C.

[57] ABSTRACT

A simplified method of manufacturing an active matrix substrate is disclosed. Gate wires, gate electrodes, gate insulating films, an etching stopper layer, semiconductor layers and contact layers are formed on an electrically insulating substrate. Pixel electrode material films, second electrical conductor films and second insulating films are formed successively on the substrate. The second insulating film and the second electrical conductor film are simultaneously patterned, so that source wires, source electrodes and drain electrodes are formed from the second electrical conductor film, and a protective film from the second insulating film. Then, the pixel electrode material film is patterned thereby to form pixel electrodes in a plurality of regions defined by the gate wires and the source wires.

3 Claims, 12 Drawing Sheets

METHOD OF MANUFACTURING ACTIVE MATRIX SUBSTRATE

BACKGROUND OF THE INVENTION

1. Field of the Invention

The present invention relates to a method of manufacturing an active matrix substrate embodied preferably for a liquid crystal display apparatus of active matrix drive type and the active matrix substrate so fabricated.

2. Description of Related Art

In liquid crystal display apparatuses, electroluminescence (hereinafter referred to as "EL") display apparatuses, plasma display apparatuses matrix-type display apparatuses capable of displaying arbitrary characters and figures, an image pattern is formed on a display screen by changing over the state of a plurality of pixels arranged in a matrix form, for example, between black and white displays depending on whether light emitted from a display screen is present or not, More specifically, these display apparatuses are so constructed that a liquid crystal layer, an EL light-emitting layer or a plasma light-emitting material layer constituting a display medium for pixels is sandwiched between a pair of substrate members provided with a plurality of pixel electrodes and counter electrodes facing the pixel electrodes. Each pixel is switched between white and black colors on the display screen by changing the magnitude of voltage applied to the electrodes and thereby changing the state of the display medium held between the electrodes, such as the orientation of the liquid crystal particles for the liquid crystal display, thereby changing the optical properties of the display medium including the optical rotary power of the liquid crystal.

An active matrix drive is used as a method for driving the display apparatuses. This driving method is implemented by a plurality of independent pixels each provided for corresponding one of the pixel electrodes and a switching device also provided for each pixel. Each switching device is connected between a pixel electrode and a wiring for transmitting signals applied to each pixel electrode, and is adapted to turn on and off the signals separately for each pixel. The display apparatuses using the active matrix drive can perform a display of high contrast as compared with the display apparatuses of a different driving type such as a simple matrix drive not using any switching devices. The switching devices include a thin film transistor (hereinafter referred to as "TFT"), a three-terminal device such as MOS (metal oxide semiconductor) and a two-terminal device such as an MIM (metal-insulator-metal) device, a varistor or a diode.

FIG. 11 is a partial plan view showing a pixel region on one of the pair of substrate members of a liquid crystal display apparatus of active matrix drive type using an inverted stagger-type TFT as a switching device. FIG. 12A is a sectional view of one of the pair of substrate members taken on line A—A, and FIG. 12B a sectional view of the same substrate member taken on line B—B of FIG. 11.

On one on face of a substrate 1 are formed a plurality of gate wires 2 arranged in parallel to each other at intervals and a plurality of source wires 3 crossing at right angles to the gate wires 2 arranged at intervals. Each gate wire 2 is insulated by being covered with a gate insulating film 11. Pixel electrodes 4 are formed respectively in a plurality of rectangular regions defined by the wires 2, 3. A TFT 5 is formed at each connection between the wires 2, 3 and each pixel electrode 4.

The TFT 5 includes a gate electrode 6 connected to the gate wire 2, a source electrode 7 connected to the source wire 3 and a drain electrode 8 connected to the pixel electrode 4. The surface of the source wire 3 and the TFT 5 is insulated generally by being covered with a protective film 19.

FIGS. 13 to 21B are plan views and sectional views for explaining the respective steps of fabricating the substrate member in FIG. 11. The fabrication steps are described below.

FIG. 13 is a partial plan view of a substrate member in the state that contact layers 14a, 14b has been formed. FIG. 14 is a sectional view taken on line A—A in FIG. 13.

First, a first electrical conductor film is formed on the substrate 1, which film is patterned to form the gate wires 2 and the gate electrodes 6. A gate insulating film 11 made of silicon nitride or the like, a first semiconductor film made of silicon or the like and a first insulating film made of silicon nitride or the like are deposited in this order all over the face provided with the gate wires 2 and the gate electrodes 6. The first insulating film formed in the topmost layer is patterned by etching or the like to form an etching stopper layer 12 on each gate electrode 6. Then, a second semiconductor film high in impurities concentration is deposited all over the face of the substrate 1 provided with the above members. The first and second semiconductor films are patterned at the same time to form a semiconductor layer 13 made of a first semiconductor film, arranged all over the region to be provided with the source electrode 7 and the drain electrode 8, and to form contact layers 14a, 14b made of the second semiconductor film are thus formed in each region to be provided with the source electrode 7 and the drain electrode 8. Then, the terminal portions of the gate insulating film 11 at the ends of the substrate for connecting the wires 2, 3 on the substrate to external circuits are removed in holes or otherwise processed, thereby forming contact holes.

FIG. 15 is a sectional view taken on line A—A in FIG. 13 showing a substrate member provided with a pixel electrode material film 15. FIG. 16A is a sectional view taken on line A—A of FIG. 13 showing a substrate member provided with a second electrical conductor film 16. FIG. 16B is a sectional view taken on line B—B of FIG. 13.

The pixel electrode material film 15 shown in FIG. 15 and the second electrical conductor film 16 shown in FIGS. 16A, 16B are formed and deposited successively on the substrate 1 provided with the layers 11 to 13 and 14a, 14b.

With the pixel electrode material film 15 as an etching barrier layer, only the second electrical conductor film 16 deposited thereon is patterned by etching, thereby forming the source wire 3 in such a manner as to cross the gate wire 2 orthogonally. The source electrode 7 is formed to connect to the source wire 3 on the contact layer 14a, and the drain electrode 8 is formed in such a manner as to connect to the pixel electrode 4 to be formed on the contact layer 14b. The TFT 5 is thus formed. This state is shown in FIGS. 17 and 18A, 18B. FIG. 17 is a partial plan view showing a substrate member. FIG. 18A is a sectional view taken on line A—A of FIG. 17, and FIG. 18A a sectional view taken on line B—B of FIG. 17.

The pixel electrode material film 15 is patterned by wet etching thereby to form the pixel electrodes 4. This state is shown in FIGS. 19 and 20A, 20B. FIG. 19 is a partial plan view showing the substrate member, FIG. 20A a sectional view taken on line A—A of FIG. 19, and FIG. 20B a sectional view taken on line B—B of FIG. 19. A second insulating film 17 is formed all over the surface of the substrate 1 provided with the pixel electrodes 4. This state is shown in FIGS. 21A, 21B. FIG. 21A is a sectional view taken on line A—A of FIG. 19, and FIG. 21B a sectional view taken on line B—B of FIG. 19. The second insulating film 17 is etched to form pixel openings 18 on the pixel electrodes 4 and contact holes at the terminal portions, followed by forming the protective film 19. When the substrate member is used for a liquid crystal apparatus, an orientation film subjected to an orientation process is formed all over the one face provided with the protective film 19. One of the pair of substrate members of FIGS. 11 and 12A, 12B is formed by these steps.

Counter electrodes are formed on one face of a substrate including a color filter to be a component of the other of the pair of substrate members in the same manner as in the pixel electrodes. At the next step, an orientation film is formed all over the one face of the substrate and is subjected to the orientation process to form the other of the pair of substrate member. The two substrate members are arranged so that the pixel electrodes of the one substrate member face the counter electrodes of the other substrate member, and glued keeping a space therebetween. Liquid crystal is injected into the space to form a liquid crystal display apparatus.

As described above, one of the pair of substrate members including switching devices of TFT or the like is fabricated through many repetitions of the steps of forming and patterning the films, and therefore the fabrication process becomes complex. This leads to the problem of a lengthened time required for fabrication of such a substrate member. Also, the great many steps of forming and patterning to which the substrate is subjected accumulates defects from each step, resulting in a reduced yield of the final product.

SUMMARY OF THE INVENTION

It is hence an object of the invention to provide a method of manufacturing an active matrix substrate and such an active matrix substrate in which the manufacturing process can be simplified without changing the functions and design of the switching device.

In one aspect of the invention, there is provided a method of manufacturing an active matrix substrate which comprises on an insulating substrate:

a plurality of gate wires arranged in parallel with each other at intervals, a plurality of source wires arranged at intervals orthogonally to the gate wires, a pixel electrode arranged respectively in rectangular pixel regions formed by the gate wires and the source wires crossing each other, a switching element arranged respectively in the pixel regions and each including a gate electrode connected to the gate wire, a source electrode connected to the source wire and a drain electrode connected to the pixel electrode, and a protective film formed on the insulating substrate including the gate wires, the source wires, the pixel electrode and the switching element, the method comprising the steps of;

forming a first electrical conductor film on the insulating substrate and forming the gate wires and the gate electrode by patterning the first electrical conductor film;

forming a gate insulating film so as to cover at least the gate wires and the gate electrode;

forming a first semiconductor film and a first insulating film successively on the insulating substrate provided with the gate insulating film, and forming an etching stopper layer on the gate electrode by patterning the first insulating film;

forming a second semiconductor film on the first semiconductor film provided with the etching stopper layer, forming a semiconductor layer by patterning the first semiconductor film in such a manner as to cover the regions where the source electrode and the drain electrode are to be formed, and forming a contact layer by patterning the second semiconductor film after the regions to be provided with the source electrode and the drain electrode; and forming a pixel electrode material film, a second electrical conductor film and a second insulating film successively in this order on the insulating substrate on which the gate wires, the gate electrode, the gate insulating film, the etching stopper layer, the semiconductor layer and the contact layer are formed, patterning the second electrical conductor film and the second insulating film at the same time to form the source electrode, the source wires and the drain electrode made of the second electrical conductor film and protective film made of the second insulating film, and patterning the pixel electrode material film after the pixel regions to form the pixel electrode.

According to another aspect of the invention, the second electrical conductor film and the second insulating film are made of a material capable of simultaneous dry etching.

According to still another aspect of the invention, the second electrical conductor film and the second insulating film are patterned simultaneously by dry etching using an etching gas capable of etching both the second electrical conductor film and the second insulating film without etching the pixel electrode material film.

According to a further aspect of the invention, there is provided an active matrix substrate comprising on an insulating substrate:

a plurality of gate wires arranged in parallel with each other at intervals;

a plurality of source wires arranged at intervals orthogonally to the gate wires;

a pixel electrode arranged respectively in rectangular pixel regions formed by the gate wires and the source wires crossing each other;

a switching element arranged respectively in the pixel regions and each including a gate electrode connected to a gate wire, a source electrode connected to a source wire and a drain electrode connected to the pixel electrode; and a protective film formed on the insulating substrate including the gate wires, the source wires, the pixel electrode and the switching element wherein the protective film covers only the top faces of the source electrode, the drain electrode and the source wires.

According to the invention, a plurality of gate wires formed by patterning the first electrical conductor film formed on the insulating substrate so as to be arranged at intervals in parallel to each other, and a gate electrode connected to the gate wires are provided. Then, at least the gate wires and the gate electrode are covered by a gate insulating film. A first semiconductor film and a second insulating film are formed in this order on the gate insulating film, and the first insulating film is patterned to form a etching stopper layer. A second semiconductor film is formed on the first semiconductor film and the etching stopper layer, and the first and the second semiconductor film are patterned to form a semiconductor layer and a contact layer.

As the next step, a pixel electrode material film, a second electrical conductor film and a second insulating film are formed in this order, and the second electrical conductor film and the second insulating film are patterned simultaneously to form source wires at intervals orthogonally crossing the gate wires, a source electrode connected to the source wires and a drain electrode connected to a pixel electrode from the second electrical conductor film, and a protective film from the second insulating film so as to cover only the top faces of the source wires, the source electrode and the drain electrode.

In this way, the source wires, the top faces of the source electrode and the drain electrode located at the uppermost position are electrically insulated by the protective film formed simultaneously with these wires and electrodes. The second electrical conductor film and the second insulating film, which are each patterned for each layer separately in the prior art, are collectively formed by patterning according to the invention. As a result, the photolithography, etching and other steps for patterning the protective film can be omitted. Consequently, the fabrication steps can be simplified, and therefore the fabrication time can be reduced. Since the number of steps is reduced for fabrication, percentage of defects accumulated at each fabrication step is reduced, thereby improving the yield of the final product. Also, the cost of the fabrication equipment can be reduced.

According to a yet further aspect of the invention, the second electrical conductor film and the second insulating film are made of a material permitting concurrent dry etching and therefore the simultaneous formation of both films described above can be attained by dry etching. Also, a gas preventing the pixel electrode material film from being etched is used for dry etching, so that only the second electrical conductor film and the second insulating film can be patterned concurrently with the pixel electrode material serving film as an etching stopper.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
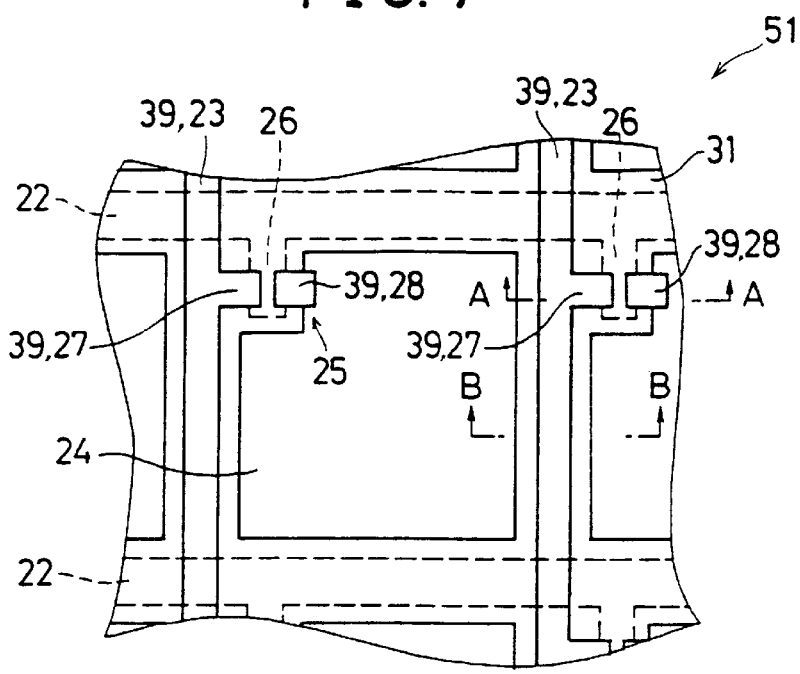
FIG. 1 is a partial plan view showing one substrate member 51 of a pair of substrate members of a liquid crystal display apparatus using an active matrix substrate of an embodiment of the invention.

Now referring to the drawings, preferred embodiments of the invention are described below.

Figure 2A:
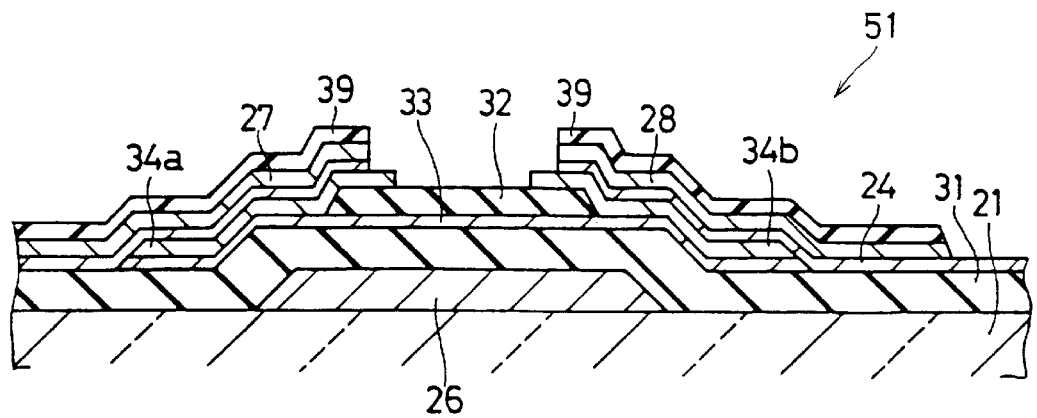
FIGS. 2A and 2B are sectional views taken on lines A—A and B—B of FIG. 1, respectively.
Figure 2B:
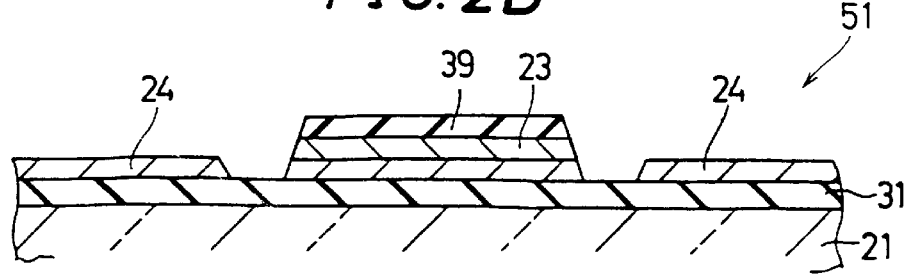

FIG. 1 is a partial plan view of one substrate member 51 of a pair of substrate members used for a liquid crystal display apparatus of active matrix drive type according to an embodiment of the invention. FIGS. 2A and 2B are sectional views of the substrate member 51 of FIG. 1, taken on lines A—A and B—B, respectively.

A plurality of gate wires 22 are arranged in parallel to each other at intervals on a substrate 21 of an insulating material. Also, a plurality of source wires 23 are arranged orthogonally to the gate wires 22 at intervals. A plurality of rectangular pixel regions defined by the gate wires 22 and the source wires 23 have respectively arranged therein a plurality of light transmitting pixel electrodes 24 realized by ITO (indium-tin oxide) or the like.

The wires 22, 23 and the pixel electrodes 24 are connected through TFTs 25 as switching devices. The TFTs 25 each include a gate electrode 26 connected to a gate wire 22, a source electrode 27 connected to a source wire 23 and a drain electrode 28 connected to a pixel electrode 24. The source wires 23 and the TFT 25 are covered and thus electrically insulated by a protective film 39 made of an insulating material similar to the source wires and formed in the manner described later.

FIGS. 3 to 9B are plan views and sectional views for explaining the sequential steps of fabricating one substrate member 51 of the pair of substrate members. The fabrication steps are described below.

Figure 3:
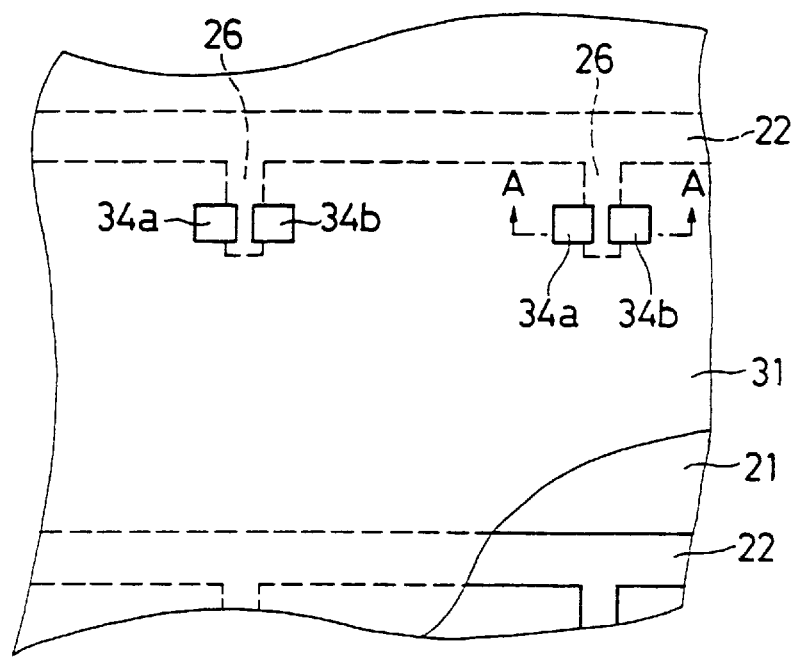
FIG. 3 is a partial plan view of a substrate 21 provided with contact layers 34a, 34b on the process of fabricating the one substrate member 51 in FIG. 1.
Figure 4:
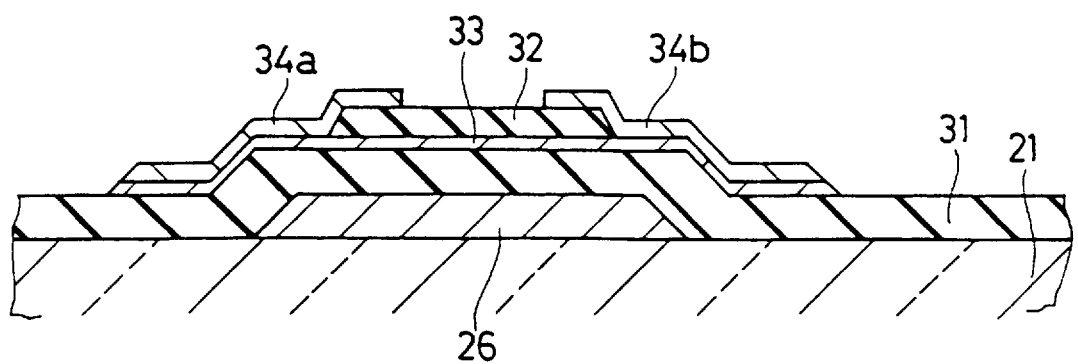
FIG. 4 is a sectional view of the one substrate member taken on line A—A of FIG. 3.

FIG. 3 is a partial plan view of the substrate 21 provided with contact layers 34a, 34b. FIG. 4 is a sectional view taken on line A—A in FIG. 3. On one face of the substrate 21 is deposited a first electrical conductor film by sputtering aluminum, molybdenum or tantalum. The substrate 21 which is an insulating substrate is realized by glass or the like. Alternatively, an insulating film of, say, $Ta_2O_5$ is formed as a base coat film on the one face of the substrate 21. Then, the first electrical conductor film is formed and patterned thereby to form the gate wires 22 and the gate electrodes 26.

In general, the patterning is carried out by etching with a photoresist. In the etching step using a photoresist, first, a substrate on one face of which a desired film material is deposited is rotated at high speed while a liquid photoresist is dripped on the deposition of the desired film material to form a photoresist thin film. This thin film with a mask having a wiring pattern or the like superposed thereon is exposed to light, and the portions exposed or not exposed are removed depending on the light sensitivity of the photoresist. More specifically, the portions of the film material to be left unremoved are covered by the photoresist. The portions of the film material not covered by the photoresist are etched off. As the last step, the photoresist is removed to end the etching process.

A gate insulating film 31 is formed and deposited by plasma CVD (chemical vapor deposition) or the like all over the face of the substrate 21 provided with the gate electrodes 26. The gate insulating film 31 is realized by a silicon nitride film of, say, 3000 Å in thickness. Alternatively, the gate insulating film 31 is realized by forming a metal oxide constituting an insulating material using the anodizing process on the surface of the gate wires 22.

In the next step, the first semiconductor film and the first insulating film are formed and deposited successively on the gate insulating film 31 by plasma CVD or the like method. The first semiconductor film is realized by a genuine semiconductor amorphous silicon film of, say, 300 Å in thickness. The first insulating film, on the other hand, is obtained by a silicon nitride film of, say, 2000 Å in thickness. This first insulating film is patterned thereby to form an etching stopper layer 32 on the gate electrodes 26.

The second semiconductor film is then deposited by plasma CVD or the like method all over the face of the substrate provided with the etching stopper layer 32 etc. This second semiconductor film is realized by a semiconductor film high in impurities concentration such as an n+ amorphous silicon film or a microcrystalline silicon film with phosphorus of 500 Å thick added thereto. As the next step, the first and second semiconductor films are patterned simultaneously, thereby forming a semiconductor layer 33 from the first semiconductor film and contact layers 34a, 34b from the second semiconductor film, respectively. The semiconductor layer 33 is formed in such a manner as to cover the regions to be provided with the source electrodes 27 and the drain electrodes 28. The semiconductor layer 33 is also formed on the gate electrodes 26 through the gate insulating film 31 thereby to constitute the channel of the TFT 25. The contact layers 34a, 34b are formed in isolation from each other in the respective regions to be provided with the source electrodes 27 and the drain electrode 22.

The use of an n+ amorphous silicon film or a microcrystalline silicon film as the contact layers 34a, 34b can form a satisfactory ohmic contact between the source electrode 27 or the drain electrode 28 and the semiconductor layer 33. Also, the etching stopper layer 32 is exposed between the contact layers 34a and 34b. The conditions for patterning the etching stopper layer 32 including the type of etching gas are different from those for patterning the second semiconductor film of the two contact layers 34a, 34b. Hence, the etching stopper layer 32 is not etched during the time when the two semiconductor layers are being etched. The central portion of the semiconductor film 33 and other films located below the etching stopper layer 32 is therefore not etched during the same process. The contact layers 34a, 34b are thus formed in isolation, while at the same time forming the semiconductor layer 33 integrally in such a position as to cover the regions to be provided with the source electrodes 27 and the drain electrodes 28.

Figure 5:
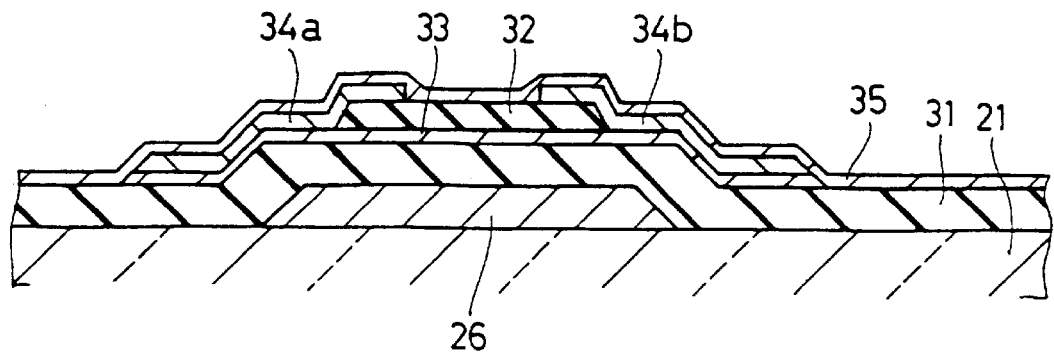
FIG. 5 is a sectional view of the substrate 21 provided with a pixel electrode material film 35 on the process of fabricating the one substrate member 51, taken on line A—A of FIG. 3.
Figure 6A:
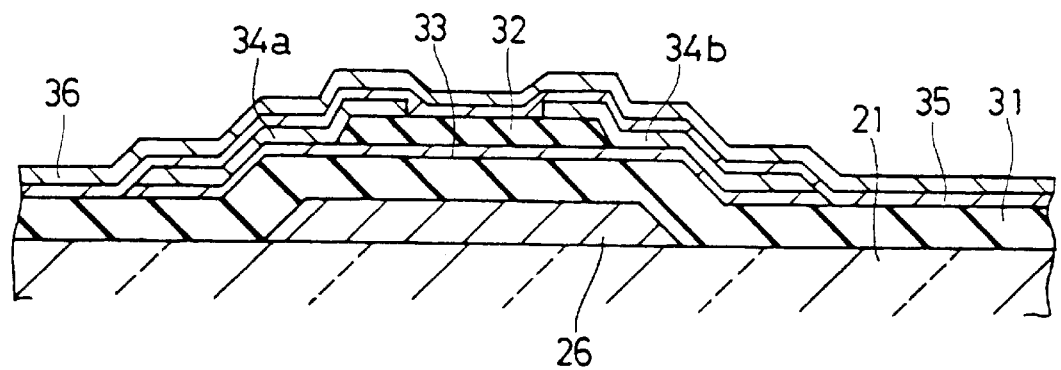
FIGS. 6A and 6B are sectional views of the substrate 21 provided with a second electrical conductor film 36 on the process of fabricating the substrate member 51 of FIG. 1; taken on line A—A and B—B of FIG. 3, respectively.
Figure 6B:
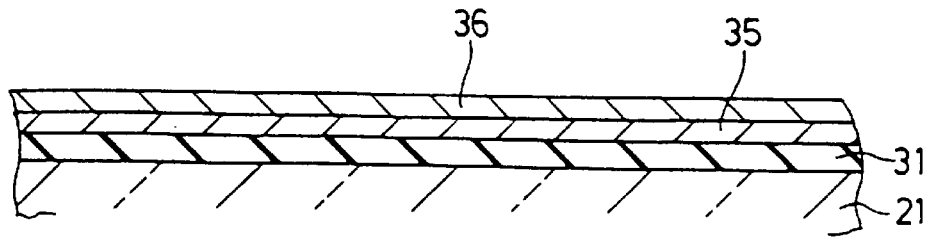
Figure 7A:
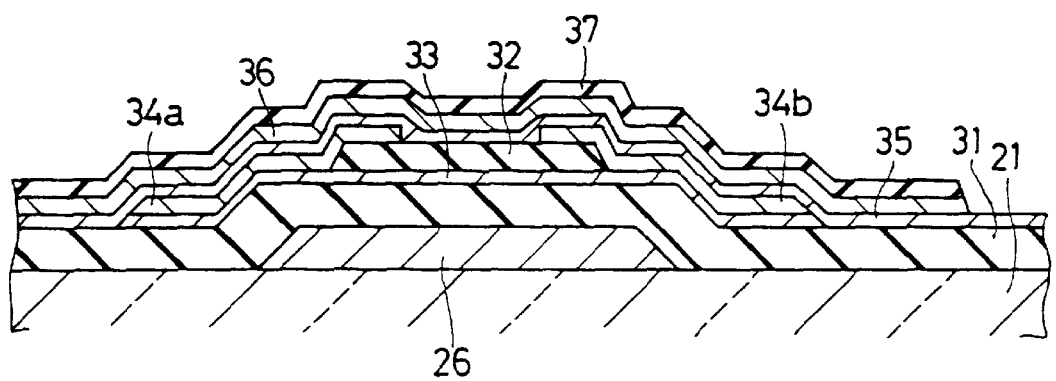
FIGS. 7A and 7B are sectional views of the substrate 21 provided with a second insulating film 37 on the process of fabricating the substrate member 51 of FIG. 1, taken on line A—A and B—B of FIG. 3, respectively.
Figure 7B:
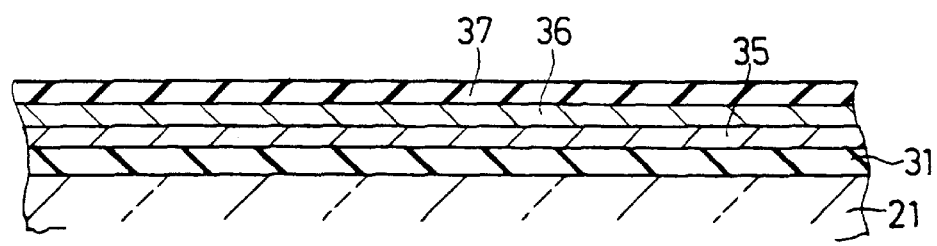

FIG. 5 is a sectional view taken in line A—A in FIG. 3, showing a substrate member provided with the pixel electrode material film 35. FIGS. 6A and 6B are sectional views taken in lines A—A and B—B respectively in FIG. 3, showing a substrate member provided with the second electrical conductor film 36 formed. FIGS. 7A and 7B are sectional views taken in lines A—A and B—B respectively in FIG. 3, showing a substrate member provided with the second insulating film 37.

After formation of the semiconductor layer 33 and the contact layers 34a and 34b, the pixel electrode material film 35 shown in FIG. 5, the second electrical conductor film 36 shown in FIGS. 6A, 6B and the second insulating film 37 shown in FIGS. 7A, 7B are then successively deposited by sputtering or the like process all over the face of the substrate. The pixel electrode material film 35 is realized by, for example, a light transmitting electrical conductor film such as an ITO film. The second electrical conductor film 36, on the other hand, is realized by a conductive film having double structures of a TaN film and a Ta film formed in that order. The second insulating film 37 is obtained by a $Ta_2O_5$ film.

The second insulating film 37 and the second electrical conductor film 36 are preferably made of a material such as Ta,TaN or $Ta_2O_5$ which permits successive etching under the same conditions including the type of etching gas. Also, the films 35 to 37 may be formed successively using the same forming device, or one by one using different forming devices.

Figure 8:
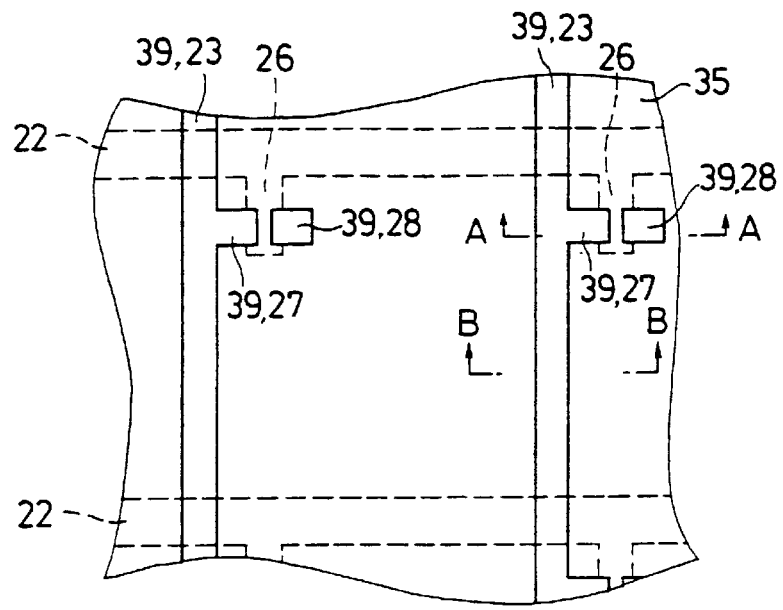
FIG. 8 is a partial plan view of the substrate 21 in which the second insulating film 37 and the second electrical conductor film 36 are patterned on the process of fabricating the substrate member 51 of FIG. 1.
Figure 9A:
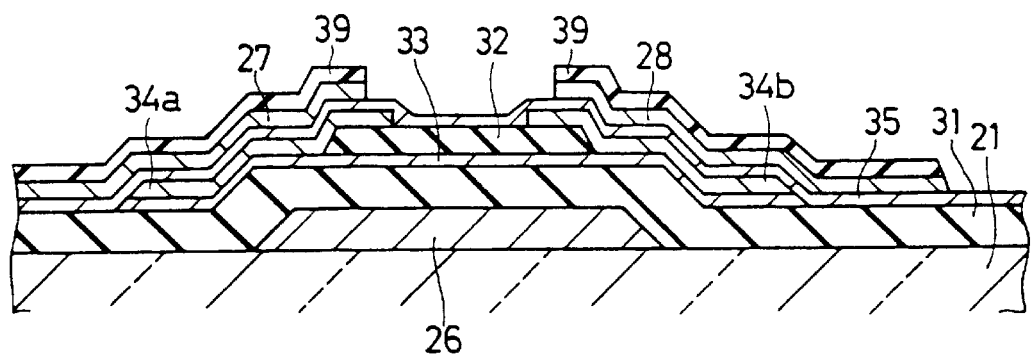
FIGS. 9A and 9B are sectional views of the substrate 21 taken on lines A—A and B—B of FIG. 8, respectively.
Figure 9B:
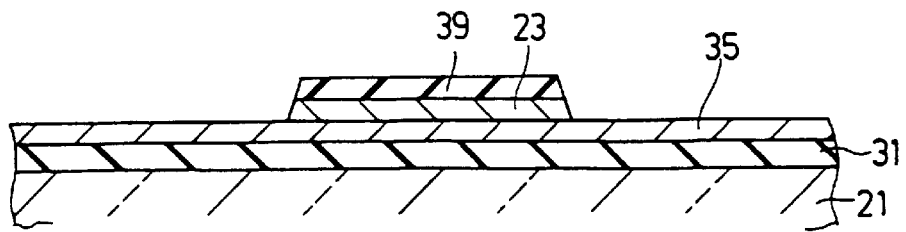

FIG. 8 is a partial plan view showing a substrate member provided with the source wires 23, the source electrodes 27, the drain electrodes 28 and the protective film 39. FIGS. 9A and 9B are sectional views taken in lines A—A and B—B of FIG. 8, respectively, in the next step, a resist pattern for forming the source wires 23, the source electrodes 27 and the drain electrodes 28 is formed using a photoresist on the second insulating film 37. The substrate provided with the resist pattern is patterned by, for example, dry etching. In the process, for example, a mixture gas of $CF_4$ and $O_2$, by which ITO is not etched and by which both the electrical conductor film of double structures including TaN and Ta films and the $Ta_2O_5$ film can be etched. As a result, the second insulating film 37 formed of $Ta_2O_5$ and the second electrical conductor film 36 of double structures formed of TaN and Ta films can be etched at the same time in the same profile with the pixel electrode material film 35 as a barrier layer. The source wires 22, the source electrodes 27 and the drain electrodes 28 made of the second insulating film 36 can thus be formed on the substrate 21. Also, the protective film 39 made of the second insulating film 37 covering only the top faces of the electrodes 27, 28 and the source wires 23 can be formed at the same time.

The pixel electrode material film 35 is patterned to form the pixel electrodes 24. When used with a liquid crystal apparatus, as the last step, an orientation film not shown subjected to an orientation process is formed in such a manner as to cover the electrodes and the wires on the one face of the substrate. These steps form a substrate member 51.

Figure 10:
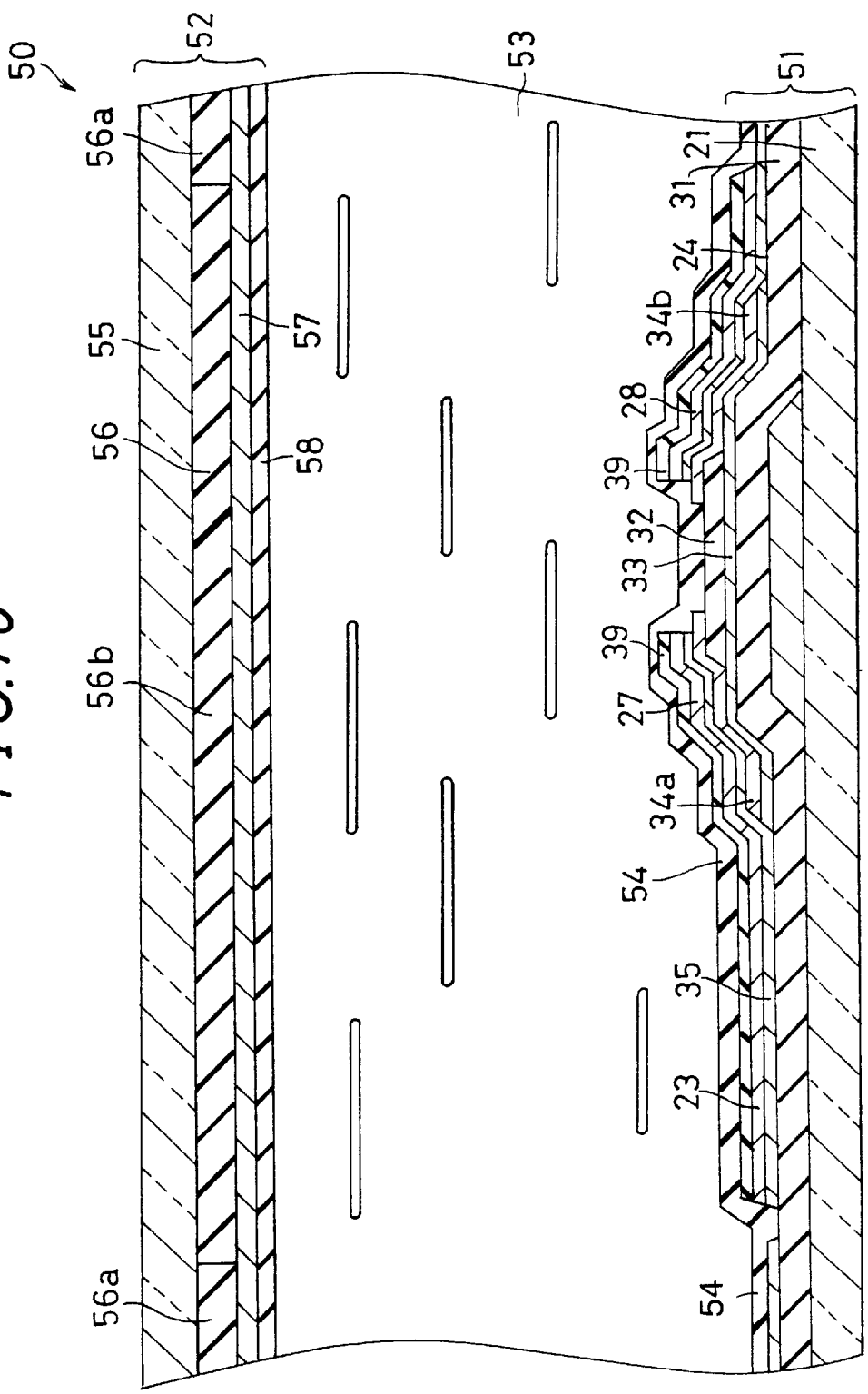
FIG. 10 is a sectional view of a liquid crystal display apparatus 50 having the substrate member 51.
Figure 11:
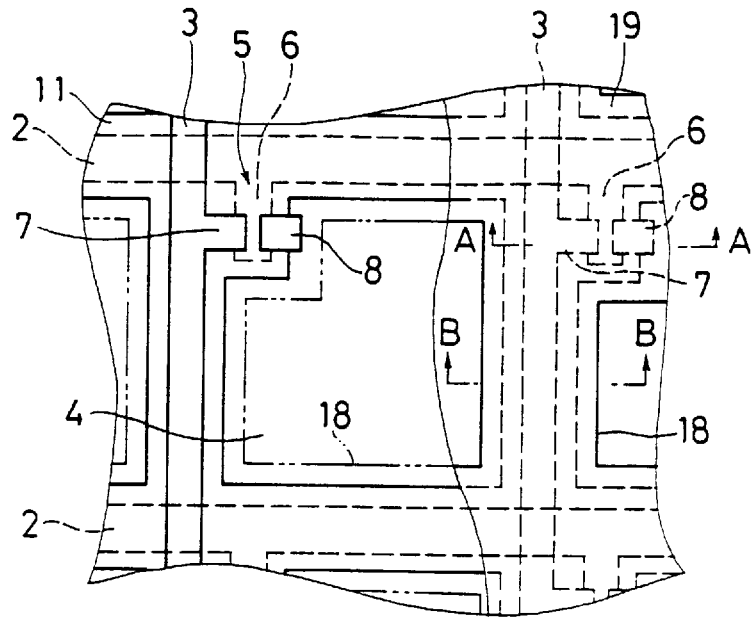
FIG. 11 is a partial plan view showing one substrate member of a pair of substrate members of a conventional liquid crystal display apparatus.
Figure 12A:
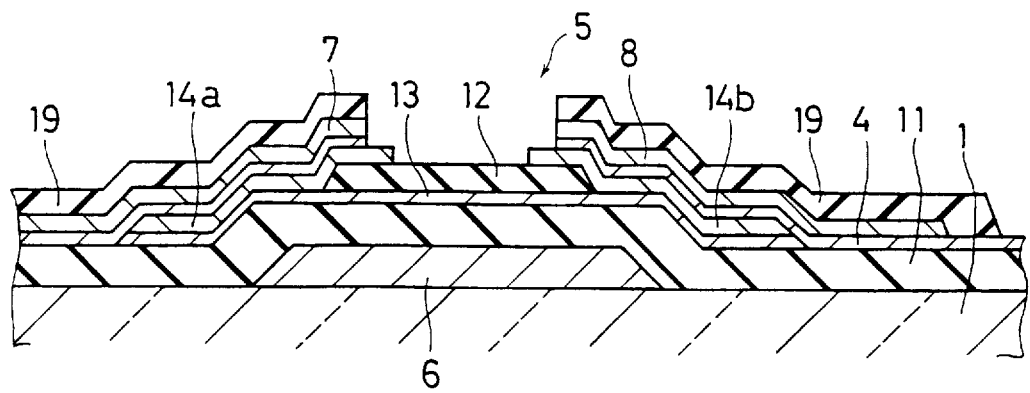
FIGS. 12A and 12B are sectional views of the substrate member taken on lines A—A and B—B of FIG. 11, respectively.
Figure 12B:
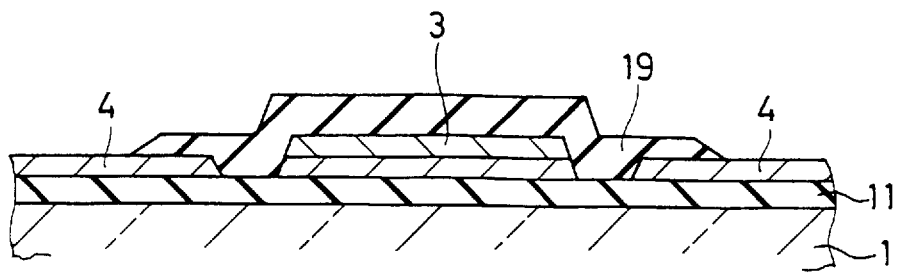
Figure 13:
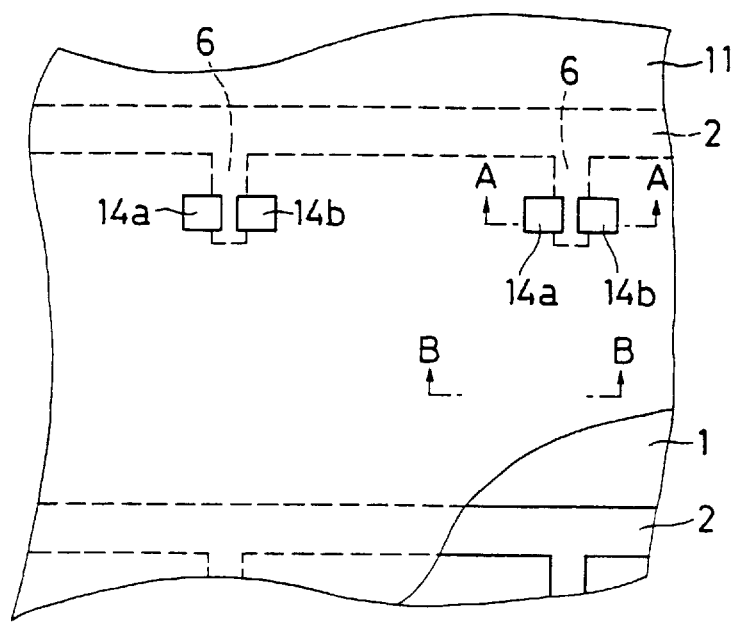
FIG. 13 is a partial plan view of a substrate 1 provided with patterned contact layers 14a and 14b on the process of fabricating the substrate member of FIG. 11.
Figure 14:
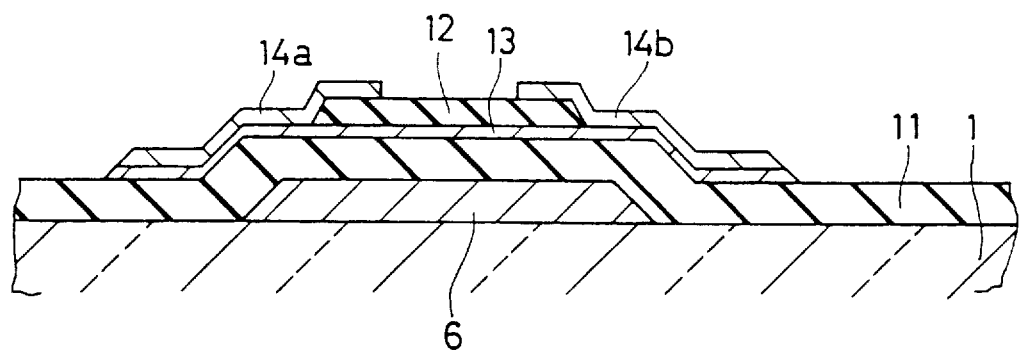
FIG. 14 is a sectional view of the substrate 1 taken on line A—A of FIG. 13.
Figure 15:
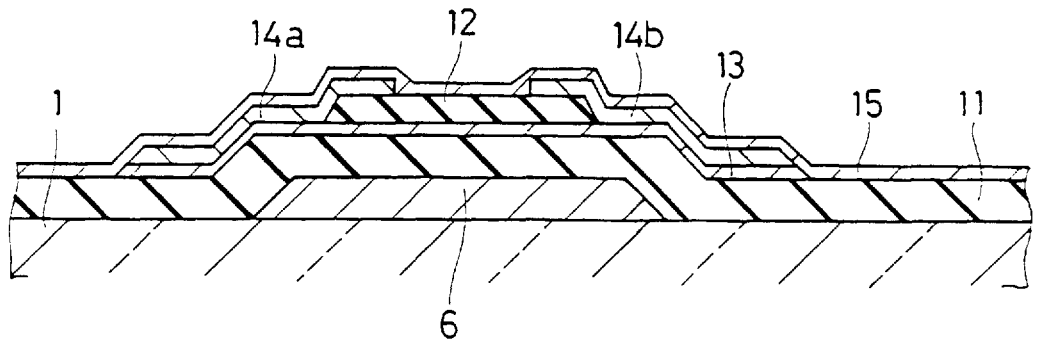
FIG. 15 is a sectional view of the substrate 1 provided with the pixel electrode material film 15 on the process of fabricating the substrate member of FIG. 11, taken on line A—A of FIG. 13.
Figure 16A:
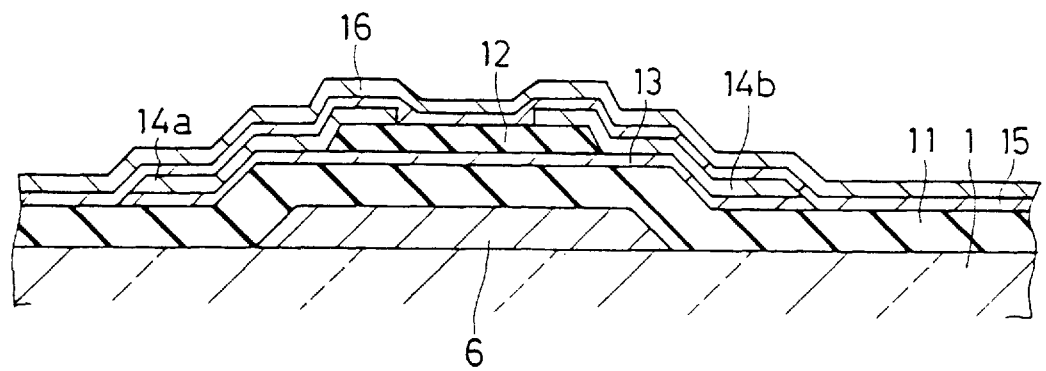
FIGS. 16A and 16B are sectional views of the substrate 1 provided with the second electrical conductor film 16 on the process of fabricating the substrate member of FIG. 11, taken on lines A—A and B—B of FIG. 13, respectively.
Figure 16B:
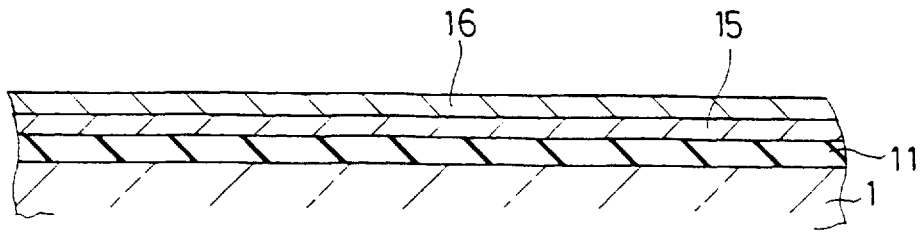
Figure 17:
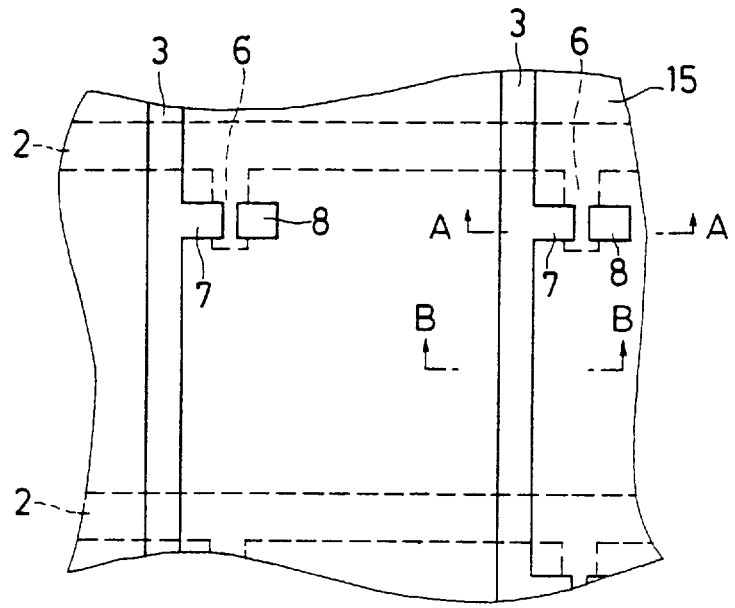
FIG. 17 is a partial plan view of the substrate 1 provided with a patterned second electrical conductor film 16 on the process of fabricating the substrate member of FIG. 11.
Figure 18A:
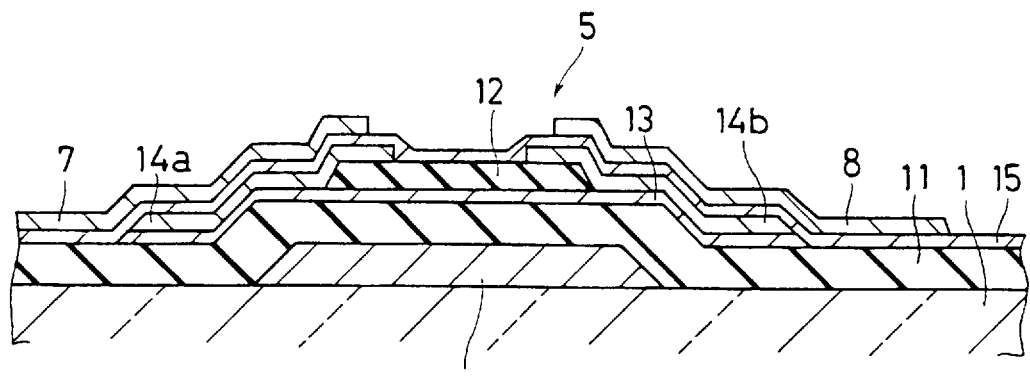
FIGS. 18A and 18B are sectional views taken on lines A—A and B—B of FIG. 17, respectively.
Figure 18B:
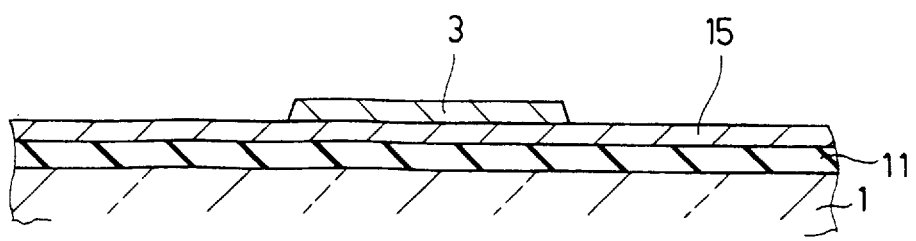
Figure 19:
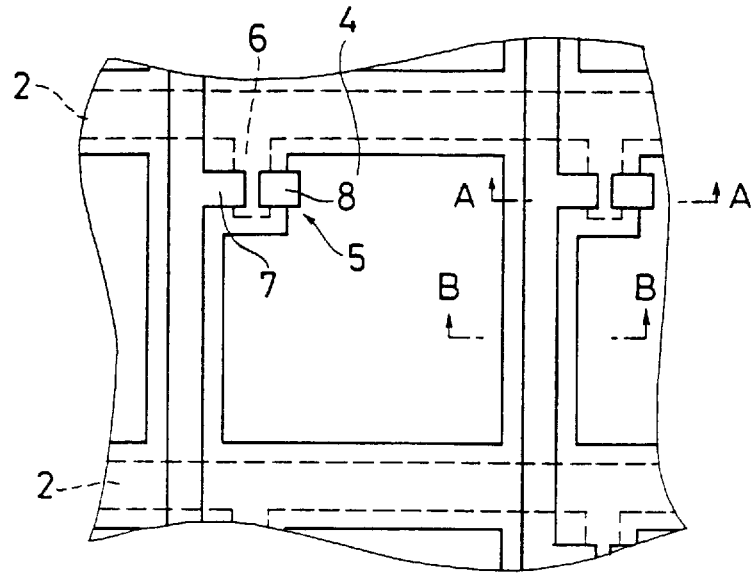
FIG. 19 is a partial plan view of the substrate 1 provided with the patterned electrode material film 15 on the process of fabricating the substrate member of FIG. 11.
Figure 20A:
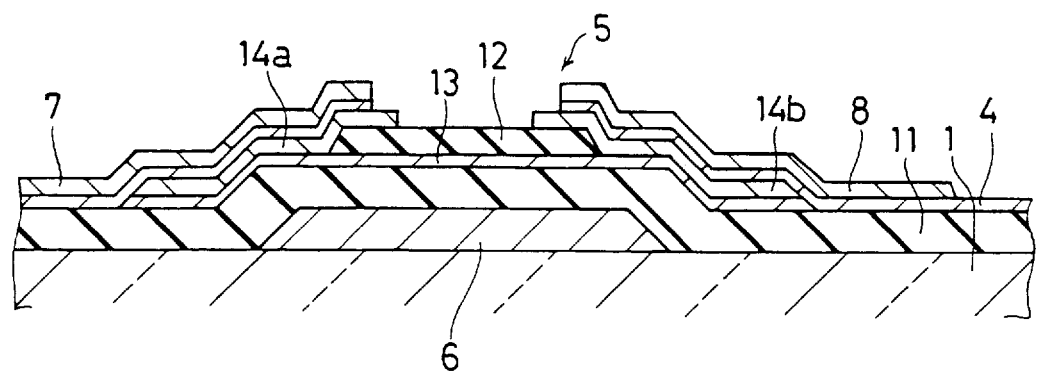
FIGS. 20A and 20B are sectional views of the substrate 1 taken on lines A—A and B—B of FIG. 19, respectively.
Figure 20B:
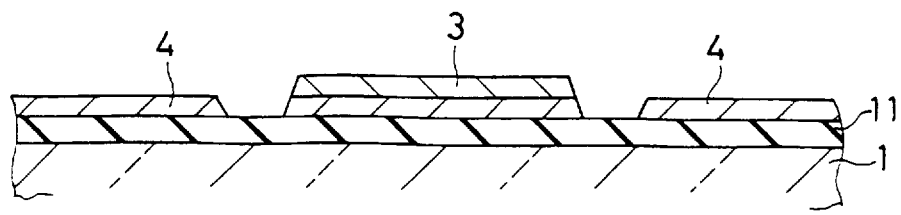
Figure 21A:
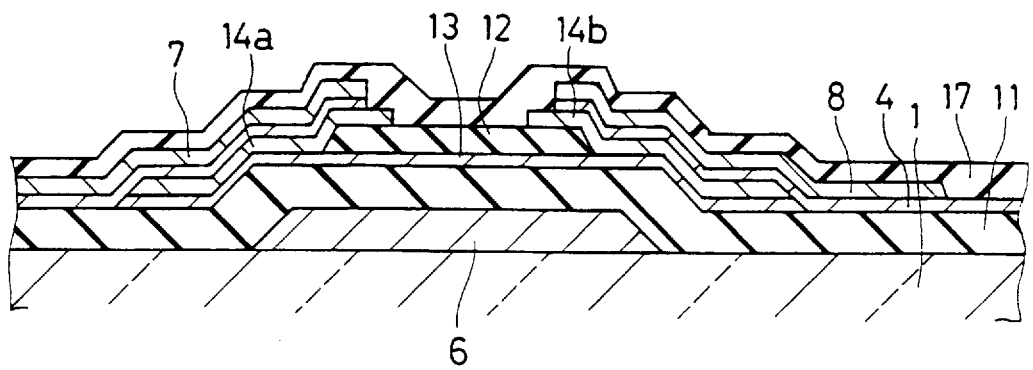
FIGS. 21A and 21B are sectional views of the substrate 1 provided with the second insulating film 17 on the process of fabricating the substrate member of FIG. 11, taken on lines A—A and B—B of FIG. 19, respectively.
Figure 21B:
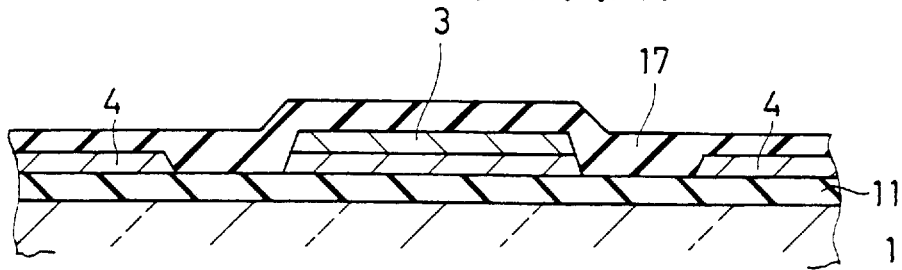

FIG. 10 is a sectional view showing the liquid crystal display apparatus having a substrate member 51. The substrate member 51 includes the orientation film 54. Counter electrodes 57 are formed on one face of the substrate 55 including a color filter 56 to be a component of the other substrate member 52 in the same manner as in the pixel electrodes 24. An orientation film 58 is formed on the one face of the substrate 55 in such a manner as to cover the electrodes 57 etc,. The other substrate member 52 is thus formed. The substrate 55 is realized by, for example, glass like the substrate 21. The counter electrode 57 is also realized by an ITO like the pixel electrodes 24. The color filter 56 includes, for example, a filter 56a arranged in a region 6 contributing to actual display, that is, a region opposed to the pixel electrode 24 and a masking filter 56b arranged in a region opposed to a TFT 25 or the wires 22, 23, for example.

This substrate member 51 and the other substrate member 52 are arranged so that the orientation films formed on the respective substrates face each other, and glued keeping a space therebetween, into which liquid crystal is injected to form a liquid crystal layer 53, thereby completing a liquid crystal display apparatus 50.

Though in this embodiment an electrical conductor film of double structures including TaN and Ta films is used as the second electrical conductor film 36, and a $Ta_2O_5$ film as the second insulating film 37 with a mixture gas of $CF_4$ and $O_2$ as an etching gas, a similar result is obtained as far as a material is used which permits successive etching of the second electrical conductor film 36 and the second insulating film 37. For example, a silicon nitride used for the gate insulating film 31 and the etching stopper layer 32 may be used as a material of the second insulating layer 37.

Although a preferable combination of the materials of the second semiconductor film 36 and the second insulating film 37 is the combination of the materials having the same etching conditions, materials having different etching conditions may be used. The second insulating film 37 is etched under different etching conditions after etching the second electrical conductor film 36 under the conditions matching the second electrical conductor film 36. Assume that an electrical conductor film of double structures of TaN and Ta films deposited on a second electrical conductor film 36 and an $SiO_2$ film is selected as a second insulating film 37. First, the $SiO_2$ film is dry etched using an $NF_3$ gas and dry etched using a $NF_3$ gas. Thereafter the electrical conductor film of double structures is dry etched using a mixture gas of $CF_4$ and $O_2$ in the same or another etching apparatus. The etching method may be a dry etching method or other etching methods.

As described above, the second electrical conductor film 36 and the second insulating layer 37 are collectively patterned, whereby the number of patterning iterations can be reduced as compared with the conventional methods in which the second electrical conductor film 36 and the second insulating film 37 are patterned separately from each other. As a consequence, the fabrication time is shortened and the yield of the final product is improved with fewer cases of fabrication defects occurring in each fabrication step, thereby reducing the fabrication cost.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A method of manufacturing an active matrix substrate which comprises on an insulating substrate:

a plurality of gate wires arranged in parallel with each other at intervals, a plurality of source wires arranged at intervals orthogonally to the gate wires, a pixel electrode arranged respectively in rectangular pixel regions formed by the gate wires and the source wires crossing each other, a switching element arranged respectively in the pixel regions and each including a gate electrode connected to the gate wire, a source electrode connected to the source wire and a drain electrode connected to the pixel electrode, and a protective film formed on the insulating substrate including the gate wires, the source wires, the pixel electrode and the switching element, the method comprising the steps of:

forming a first electrical conductor film on the insulating substrate and forming the gate wires and the gate electrode by patterning the first electrical conductor film;

forming a gate insulating film so as to cover at least the gate wires and the gate electrode;

forming a first semiconductor film and a first insulating film successively on the insulating substrate provided with the gate insulating film, and forming an etching stopper layer on the gate electrode by patterning the first insulating film;

forming a second semiconductor film on the first semiconductor film provided with the etching stopper layer, forming a semiconductor layer by patterning the first semiconductor film in such a manner as to cover the regions where the source electrode and the drain electrode are to be formed, and forming a contact layer by patterning the second semiconductor film over both regions to be provided with the source electrode and the drain electrode; and forming a pixel electrode material film, a second electrical conductor film and a second insulating film successively in this order on the insulating substrate on which the gate wires, the gate electrode, the gate insulating film, the etching stopper layer, the semiconductor layer and the contact layer are formed, patterning the second electrical conductor film and the second insulating film at the same time to form the source electrode, the source wires and the drain electrode made of the second electrical conductor film and protective film made of the second insulating film, and patterning the pixel electrode material film over the pixel regions to form pixel electrode.

2. The method of claim 1, wherein the second electrical conductor film and the second insulating film are made of any one of Ta, TaN and $Ta_2O_5$, which materials capable of simultaneous dry etching.

3. The method of claim 2, wherein the second electrical conductor film and the second insulating film are patterned simultaneously by dry etching using a mixed gas of $CF_4$ and $O_2$ capable of etching both the second electrical conductor film and the second insulating film without etching the pixel electrode material film.

* * * * *